United States Patent
Nolan et al.

(10) Patent No.: US 10,701,778 B2
(45) Date of Patent: Jun. 30, 2020

(54) LIGHTING DEVICE LED MODULE WITH EFFECTS FOR COLOR TEMPERATURE TUNING AND COLOR TUNING

(71) Applicant: SIGNIFY HOLDING B.V., Eindhoven (NL)

(72) Inventors: Christopher D. Nolan, Camillus, NY (US); Joseph R. Casper, Baldwinsville, NY (US); Benjamin David Vollmer, Manlius, NY (US); George Dederich, Jamesville, NY (US)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/595,966

(22) Filed: Oct. 8, 2019

(65) Prior Publication Data

US 2020/0045787 A1 Feb. 6, 2020

Related U.S. Application Data

(63) Continuation of application No. 16/191,902, filed on Nov. 15, 2018, now Pat. No. 10,470,270, which is a
(Continued)

(51) Int. Cl.
*F21V 21/00* (2006.01)
*H05B 45/20* (2020.01)
(Continued)

(52) U.S. Cl.
CPC ............ *H05B 45/20* (2020.01); *B60Q 1/08* (2013.01); *B60Q 1/115* (2013.01); *B60Q 1/18* (2013.01);
(Continued)

(58) Field of Classification Search
CPC .. F21Y 2115/10; F21V 23/003; F21V 23/005; F21V 23/006; F21V 23/007
(Continued)

(56) References Cited

U.S. PATENT DOCUMENTS 6,030,099 A  2/2000  McDermott
7,416,312 B1  8/2008  McDermott
(Continued)

FOREIGN PATENT DOCUMENTS

CN  103548159 A  1/2014
WO  2012145766 A2  10/2012

*Primary Examiner* — Thuy V Tran

(57) ABSTRACT

A lighting system includes a lighting device that further includes a housing, and light emitting diode (LED) modules positioned in an opening of the housing to emit light away from the housing. Each LED module includes a substrate, a plurality of module-level conductors, and a plurality of LED sets, each of which comprises a first section including a first group of LEDs, one or more additional sections (each including an additional group of LEDs), a first conductive element that electrically connects the first section to a first one of the module-level conductors, and one or more additional conductive elements. The lighting system also includes a sensor and a control circuitry configured to generate commands to control drive currents delivered to the first group of LEDs in each LED set and each additional group of LEDs in each LED set based on the data collected by the sensor.

24 Claims, 13 Drawing Sheets

Related U.S. Application Data continuation of application No. 15/670,659, filed on Aug. 7, 2017, now Pat. No. 10,154,560.

(60) Provisional application No. 62/371,394, filed on Aug. 5, 2016.

(51) Int. Cl.

| | | |
|---|---|---|
| *F21S 10/02* | (2006.01) | |
| *H05B 33/08* | (2020.01) | |
| *H01L 25/075* | (2006.01) | |
| *H01L 33/50* | (2010.01) | |
| *H01L 33/58* | (2010.01) | |
| *H01L 33/62* | (2010.01) | |
| *H01L 33/64* | (2010.01) | |
| *F21S 41/19* | (2018.01) | |
| *B60Q 1/08* | (2006.01) | |
| *B60Q 1/115* | (2006.01) | |
| *B60Q 1/18* | (2006.01) | |
| *F21S 10/06* | (2006.01) | |
| *F21V 23/04* | (2006.01) | |
| *F21V 23/00* | (2015.01) | |
| *F21Y 115/10* | (2016.01) | |
| *H01L 33/60* | (2010.01) | |

(52) U.S. Cl.
CPC ............ *F21S 10/023* (2013.01); *F21S 10/06* (2013.01); *F21S 41/192* (2018.01); *F21V 23/0492* (2013.01); *H01L 25/0753* (2013.01); *H01L 33/502* (2013.01); *H01L 33/58* (2013.01); *H01L 33/62* (2013.01); *H01L 33/642* (2013.01); *H05B 33/0863* (2013.01); *F21V 23/003* (2013.01); *F21V 23/005* (2013.01); *F21V 23/006* (2013.01); *F21V 23/007* (2013.01); *F21Y 2115/10* (2016.08); *H01L 33/504* (2013.01); *H01L 33/60* (2013.01)

(58) Field of Classification Search
USPC .......................................... 362/249.02, 362
See application file for complete search history.

(56) References Cited

U.S. PATENT DOCUMENTS

| | | |
|---|---|---|
| 8,018,151 B2 | 9/2011 | Chung et al. |
| 8,456,109 B1 | 6/2013 | Wray |
| 8,735,914 B2 | 5/2014 | Agatani et al. |
| 8,773,007 B2 | 7/2014 | Van De Ven et al. |
| 9,484,329 B2 | 11/2016 | Van De Ven et al. |
| 2008/0099772 A1 | 5/2008 | Shuy |
| 2010/0165618 A1 | 7/2010 | Vissenberg et al. |
| 2012/0038291 A1 | 2/2012 | Hasnain |
| 2013/0181619 A1* | 7/2013 | Tischler .................. H01L 33/32 315/185 R |
| 2014/0232288 A1 | 8/2014 | Brandes et al. |
| 2014/0362582 A1 | 12/2014 | Van De Ven et al. |
| 2015/0170584 A1 | 6/2015 | Casper et al. |
| 2015/0173151 A1 | 6/2015 | Ter Weeme et al. |
| 2015/0338041 A1 | 11/2015 | Wimmer et al. |
| 2017/0358625 A1 | 12/2017 | Tischler et al. |
| 2018/0249549 A1* | 8/2018 | Kim ........................ F21S 10/02 |

* cited by examiner

| CENTER | MIDDLE | OUTER | TOTAL | CANDELA | NEMA BEAM | DMX |
|---|---|---|---|---|---|---|
| 100 | 0 | 0 | 100 | 762 | 2.00 | 0 |
| 95 | 5 | 0 | 100 | 724 | 2.18 | 15 |
| 90 | 10 | 0 | 100 | 687 | 2.35 | 30 |
| 85 | 15 | 0 | 100 | 649 | 2.53 | 45 |
| 80 | 20 | 0 | 100 | 611 | 2.71 | 60 |
| 75 | 25 | 0 | 100 | 573 | 2.88 | 75 |
| 70 | 30 | 0 | 100 | 535 | 3.06 | 90 |
| 65 | 35 | 0 | 100 | 498 | 3.24 | 105 |
| 60 | 40 | 0 | 100 | 460 | 3.41 | 120 |
| 55 | 45 | 0 | 100 | 422 | 3.59 | 135 |
| 50 | 50 | 0 | 100 | 384 | 3.77 | 150 |
| 47 | 47 | 6 | 100 | 362 | 3.87 | 159 |
| 44 | 44 | 12 | 100 | 339 | 3.98 | 168 |
| 41 | 41 | 18 | 100 | 317 | 4.08 | 177 |
| 38 | 38 | 24 | 100 | 294 | 4.19 | 186 |
| 35 | 35 | 30 | 100 | 271 | 4.30 | 195 |
| 33 | 33 | 34 | 100 | 256 | 4.37 | 201 |
| 30 | 33 | 37 | 100 | 234 | 4.47 | 210 |
| 27 | 33 | 40 | 100 | 211 | 4.58 | 219 |
| 24 | 33 | 43 | 100 | 188 | 4.69 | 228 |
| 21 | 33 | 46 | 100 | 166 | 4.79 | 237 |
| 18 | 33 | 49 | 100 | 143 | 4.90 | 246 |
| 15 | 33 | 52 | 100 | 121 | 5.00 | 255 |

FIG. 12A

LIGHTING DEVICE LED MODULE WITH EFFECTS FOR COLOR TEMPERATURE TUNING AND COLOR TUNING

RELATED APPLICATIONS AND CLAIM OF PRIORITY

This application is a continuation of U.S. patent application Ser. No. 16/191,902, filed Nov. 15, 2018, which is now U.S. Pat. No. 10,470,270, and which is a continuation of U.S. patent application Ser. No. 15/670,659 now U.S. Pat. No. 10,154,560, filed Aug. 7, 2017, which in turn claims priority to U.S. Provisional Patent Application No. 62/371,394, filed Aug. 5, 2016. The disclosure of all such priority documents are fully incorporated into this document by reference.

BACKGROUND

The advent of light emitting diode (LED) based luminaires has provided sports arenas, stadiums, other entertainment facilities and other commercial and industrial facilities the ability to achieve instant on-off capabilities, intelligent controls and adjustability while delivering excellent light quality, consistent light output and improved energy efficiency. Because of this, users continue to seek improvements in LED lighting devices. For example, new and improved ways to direct light in multiple directions, and maintenance of certain characteristics of light such as intensity or color temperature, are desired. However, accurate control has been limited because of the manual operation required to change colors, intensities, and positions associated with overhead light fixtures.

White light sources that use LEDs in their construction can have two basic configurations. In one, referred to as direct emission LEDs, white light is generated by direct emission of different colored LEDs. Examples include a combination of a red LED, a green LED, and a blue LED in a surface mounted device (SMD) LED. The other basic configuration includes a phosphor-based single LED that generates a beam in a narrow range of wavelengths, which impinges upon and excites a phosphor material to produce visible light. Typically, the LED die or chip generates blue light in the visible part of the spectrum and the phosphor re-emits yellow or a combination of green and red light, green and yellow or yellow and red light. The portion of the visible blue light generated by the LED which is not absorbed by the phosphor mixes with the yellow light emitted to provide light which is perceived by the human eye as being white in color. The color temperature of an LED is determined by the phosphor composition incorporated in the LED. Advantages of phosphor based LEDs over direct emission white LEDs include better color stability as a function of device aging and temperature, and better batch-to-batch and device-to-device color uniformity/repeatability.

Color tuning of LEDs, especially direct emission white LEDs, can be difficult to implement. Chip-on-board (COB) LEDs include multiple die (typically 9 or more) that are wired to operate as one electrical device and assembled with a single optical emitting surface, and hence require multiple channels to adjust individual levels of light output to create color changing effects.

Beam control in COB LEDs is also difficult. Typically, an LED lighting device is designed to provide a fixed beam pattern and spread using diffusers, total internal reflection (TIR) optics and/or collimators. If a particular light fixture is designed to provide a "wide" beam, the fixture generally cannot be adjusted easily to produce a "narrow" beam. Typically, changing the beam pattern requires changing the lighting device itself, providing a lighting device with motor-controlled movement, or manually adjusting one or more structural features of the lighting device's housing.

When there are multiple COB LEDs under a single optical source (lens), the high number of LEDs and complexity of optical and electrical components makes color tuning and beam control even more difficult.

This document describes new lighting devices that are directed to solving the issues described above, and/or other problems.

SUMMARY

In various embodiments, a lighting device includes a substrate on which a plurality of light emitting diode (LED) devices are installed. Each LED device includes a set of LEDs over which an optical lens is positioned. Each LED set is divided into multiple sections that are optionally separated by a non-conductive divider material. The color temperature or color of light emitted by the device may be controlled by selectively activating the LEDs under each section. The beam shape of light emitted may be controlled by selectively activating the LEDs under each section. If the sections are arranged in concentric rings, then the beam spread of light emitted also may be controlled by selectively activating the LEDs under each section.

In an embodiment, a light emitting diode (LED) module for a lighting device includes a substrate, a plurality of module-level conductors, and a plurality of LED sets. Each LED set includes a first section including first group of LEDs, a second section including a second group of LEDs, a first conductive element that electrically connects the first section to a first one of the module-level conductors, and a second conductive element that electrically connects the second section to a second one of the module-level conductors. The sections of each LED set are configured to emit light of different luminescent properties, such as different colors, color rendering indices, Duv values, or different color temperatures. Thus, the sections can be grouped into units having common luminescent properties, and each module-level conductor drives one of the units so that all sections of all of the LED sets corresponding to that unit are driven by one of the module-level conductors.

Optionally, at least some of the LED sets may include at least one additional section including an additional group of LEDs. For each additional section, an additional conductive element may electrically connects that additional section to an additional one of the module-level conductors. One or more optical lenses may cover each of the sections of any LED set. One or more non-conductive dividers may be positioned to separate the sections of each LED set.

Optionally, the first section of each LED set may be coated with a first phosphor coating, and the second section of each LED set may be coated with a second phosphor coating, to provide the first and second sections of each LED set with the different luminescent properties. For example, the sections may exhibit different color temperatures, and the color temperature of each section may be a function of one or more of the following: (i) a number of LEDs in the group of LEDs; (ii) one or more characteristics of LEDs in the group of LEDs; (iii) a concentration of phosphor particles in a phosphor coating on the group of LEDs; or (iv) one or more light emitting characteristics of a phosphor coating on the group of LEDs.

Optionally, the LEDs sets may be arranged on the substrate such that the sections of at least some of the LED set are positioned to be skewed with respect to at least one adjacent LED set.

An LED module such as that described above may be part of a lighting device that includes a housing, along with one or more of the (LED) modules positioned in an opening of the housing and configured to emit light away from the housing. The lighting device also may include a power supply and a controller. The controller may be configured to selectively direct current from the power supply to the module-level conductors to selectively drive each of the sections of each LED set.

The lighting device also may include control circuitry programmed to generate commands to control drive currents delivered to the first group of LEDs and the second group of LEDs in each LED set so that the lighting device emits light of a specified color temperature. By way of example, the first color temperature may be in a range of 3000 K-4000 K, and the second color temperature may be in a range of 6000 K-7000 K.

In some embodiments of the lighting device, the first group of LEDs in each set exhibits a first color, each additional group of LEDs in each set exhibits a different color, and the lighting device further comprises control circuitry programmed to generate commands to control drive currents delivered to each of the groups of LEDs in each LED set so that the lighting device emits light of a specified one of the colors.

In various other embodiments, a lighting system includes a lighting device that may include a housing, and one or more light emitting diode (LED) modules positioned in an opening of the housing and configured to emit light away from the housing. Each LED module may include a substrate, a plurality of module-level conductors, a plurality of LED sets. Each LED set may include a first section including a first group of LEDs, one or more additional sections, each including an additional group of LEDs, a first conductive element that electrically connects the first section to a first one of the module-level conductors, and one or more additional conductive elements, each of which electrically connects an additional section of one or more of the LED sets section to an additional one of the module-level conductors. The first section and at least one of the one or more additional sections are configured to emit light of different luminescent properties. The lighting system may also include control circuitry that is configured to generate commands to control drive currents delivered to the first group of LEDs in each LED set and each additional group of LEDs in each LED set so that the lighting device emits light of a specified color temperature.

In some embodiments, the lighting device may also include a power supply, and a controller configured to selectively direct current from the power supply to the module-level conductors to selectively drive each of the sections of each LED set.

In some embodiments, the lighting device may also include one or more non-conductive dividers configured to separate each of the sections of each LED set.

Optionally, the first section of each LED set may be coated with a first phosphor coating and each additional section of each LED set may be coated with one or more different phosphor coatings to provide the sections of each LED set with the different luminescent properties.

In one or more embodiments, different luminescent properties may include different colors, different color rendering indices, different Duv values and/or different color temperatures.

Optionally, different luminescent properties may include different color temperatures, and each group of LEDs exhibits a color temperature that is a function of a number of LEDs in the group of LEDs, one or more characteristics of LEDs in the group of LEDs, a concentration of phosphor particles in a phosphor coating on the group of LEDs, and/or one or more light emitting characteristics of a phosphor coating on the LED set.

Optionally, the first section may be configured to emit light of color temperature that is in a range of 3000 K-4000 K, and at least one of the one or more additional sections may be configured to emit light of color temperature that is in a range of 6000 K-7000 K.

In certain embodiments, the first group of LEDs in each LED set may exhibit a first color, each additional group of LEDs in each LED set may exhibit a different color. Optionally, the lighting device may include control circuitry programmed to generate commands to control drive currents delivered to each of the groups of LEDs in each LED set so that the lighting device emits light of a specified one of the colors.

In at least one embodiment, each of the LED modules of the lighting device further may include an optical lens that covers each section of the module.

In certain embodiments, a lighting system, may include a lighting device. The lighting device may include one or more light emitting diode (LED) modules positioned in an opening of the housing and configured to emit light away from the housing. Each LED module may include a substrate, a plurality of module-level conductors, and a plurality of LED sets. Each LED set may include a first section including a first group of LEDs, one or more additional sections, each including an additional group of LEDs, a first conductive element that electrically connects the first section to a first one of the module-level conductors, and one or more additional conductive elements, each of which electrically connects an additional section of one or more of the LED sets section to an additional one of the module-level conductors. The first section and at least one of the one or more additional sections are configured to emit light of different luminescent properties, the first group of LEDs in each LED set exhibits a first color, and each additional group of LEDs in each LED set exhibits a different color. The lighting system may also include control circuitry that is configured to generate commands to control drive currents delivered to each of the groups of LEDs in each LED set so that the lighting device emits light of a specified one of the colors.

BRIEF DESCRIPTION OF THE DRAWINGS

FIGS. 12A-B illustrate an example method of adjusting beam spread (width) of an LED lighting device.

DETAILED DESCRIPTION

As used in this document, the singular forms "a," "an," and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to."

When used in this document, terms such as "top" and "bottom," "upper" and "lower", or "front" and "rear," are not intended to have absolute orientations but are instead intended to describe relative positions of various components with respect to each other. For example, a first component may be an "upper" component and a second component may be a "lower" component when a light fixture is oriented in a first direction. The relative orientations of the components may be reversed, or the components may be on the same plane, if the orientation of a light fixture that contains the components is changed. The claims are intended to include all orientations of a device containing such components.

The term "color" as used herein with reference to light is meant to describe a characteristic average wavelength of the light that results in the general appearance of a color. The term it is not meant to limit the light to a single wavelength. Thus, light of a particular color (e.g., green, red, blue, yellow, etc.) includes a range of wavelengths that are grouped around an average wavelength that results in light which generally appears to be of the particular color. Light of a particular color may also be characterized by a specific combination of discrete wavelengths that, in combination, exhibit the particular color.

Figure 1:
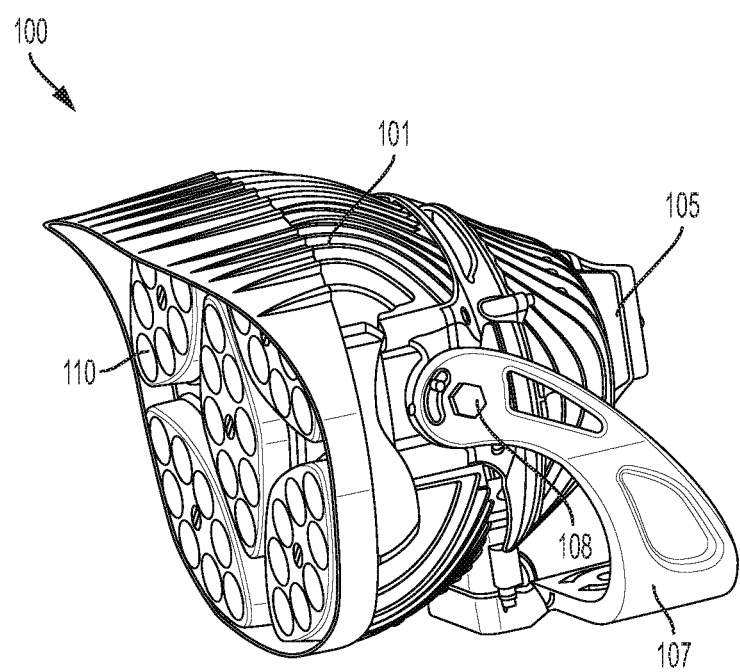
FIG. 1 illustrates a lighting device.

FIG. 1 illustrates an example of one embodiment of a lighting device that may include a various lighting modules. As shown in FIG. 1, the lighting device 100 includes a housing 101 that encases various components of a light fixture. The housing 101 includes an opening in which various LED modules 110 are positioned. Any number of LED modules 110, such as one, two, three, four, five or more may be positioned within the opening in any configuration.

The device's housing 101 may include a body portion that serves as a heat sink for dissipating heat that is generated by the LEDs. The body/heat sink may be formed of aluminum and/or other metal, plastic or other material, and it may include any number of fins on the exterior to increase its surface area that will contact a surrounding cooling medium (typically, air). Thus, the body portion may have a bowl shape, the LED modules 110 may fit within the opening of the bowl, and heat from the LEDs may be drawn away from the LED modules 110 and dissipated via the fins on the exterior of the housing 101.

While the LED modules 110 are positioned at one side of the body, the opposing side of the body may include or be connected to a power supply 105. The power supply may include a battery, solar panel, or circuitry to receive power from an external and/or other internal source. The external housing of the power supply 105 also may include fins to help dissipate heat from the power supply 105. Power wiring may be positioned within the body to direct power from the power supply to the LEDs. The housing 101 also may include a controller (such as a processor and memory with programming instructions, an application-specific integrated circuit or a system-on-a-chip) configured to selectively control which groups of LEDs in the LED modules are to receive power, and to vary the power delivered to the LEDs by methods such as pulse width modulation. The housing also may include a receiver for receiving commands from an external controller. The housing 101 may be attached to a support structure, such as a base or mounting yoke 107, optionally by one or more connectors 108. As shown, the connectors 108 may include axles about which the housing 101 and/or mounting yoke 107 may be rotated to enable the lighting device to be positioned to direct light at a desired angle.

Figure 2:
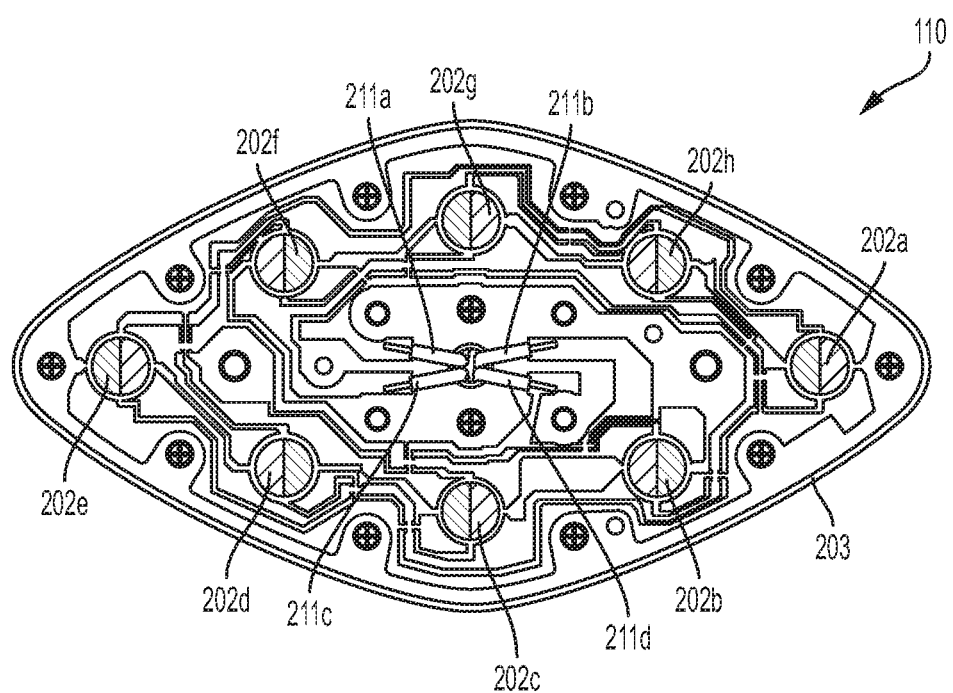
FIG. 2 illustrates an example of an LED module for a lighting device such as that of FIG. 1.

FIG. 2 illustrates an example of an LED module 110 that includes a substrate 203 on which several sets of LEDs 202a-202h are attached. The LED sets are positioned to emit light away from the lighting device. In addition, the substrate may be of any shape, such as the football-shape shown, or a square, circle, oval, diamond, rectangle, or any other shape. Various conductors and/or electronic devices, and lenses for the LED sets, may be mounted on the substrate. For example, a set of module-level conductors 211a-211d may be connected to the lighting device's power source (via a controller) and ground. Each module-level conductor may be connected to one of the conductive elements for each LED set (described below) to selectively deliver current to one of the LED sections in each LED set.

One or more control circuits (such as control cards) may be positioned under, adjacent to or otherwise near the LEDs to provide power to each LED set. The LEDs to which power is supplied may be selectively controlled by control circuitry. The control circuit may include a supporting substrate made of a material such as fiberglass, and a non-transitory computable-readable memory for storing programming instructions and/or monitored data and/or operational history data, one or more processors, a field programmable gate array (FPGA), application specific integrated circuit (ASIC) or other integrated circuit structures, and a received for receiving control signals from an external transmitter.

Figure 3:
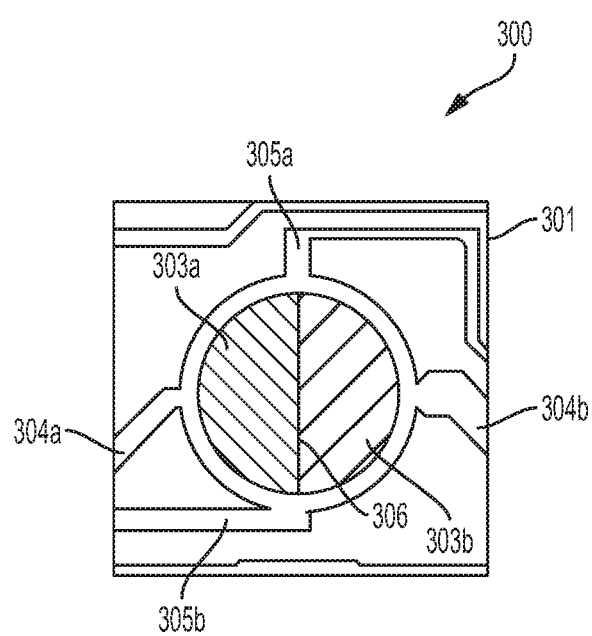
FIG. 3 illustrates an LED set configuration for an LED module such as that of FIG. 1, and configured for providing tunable color or color temperature light, according to various embodiment.

FIG. 3 illustrates an expanded view of an LED set, according to an embodiment. As shown, an LED set 300 includes a substrate 301 (such as a printed circuit board) on which various groups of LEDs (contained in each section 303a-b) are positioned under a common lens. Alternatively, each section, or various groups of LEDs within each section, may include its own associated covering lens. In an embodiment, a silicone or other optional non-conductive divider may prevent mixing of light from different sections and/or may include reflective properties. The LED set may include COB LEDs in which multiple die are bonded directly to allow for optimum heat dissipation, and solderless fabrication. The die may be blue, red, yellow, or any other desired color. Alternatively, the LED set may be formed of chip scale packaging (CSP) LEDs, or other types of LEDs. The LEDs (or multiple dies) are subgrouped so that each subgroup is wired to operate as one electrical device with two contacts, irrespective of the number of dies or LEDs.

For example, as shown in FIG. 3, each subgroup of one or more LEDs or may make up a section 303a, 303b of the LED set. Each section 303a, 303b is connected to a positive conductive element 304a, 304b (such as a conductive trace) for connection to the power source via one of the module-level conductive elements, and to a ground conductive element 305a, 305b to provide an electrical path to ground. Each section of each LED set will have its own dedicated positive conductive element so that one of the module-level conductive elements will deliver current to one of the sections of each LED set. The positive conductive trace for each section will lead to a power source (e.g., via conductors 211a and 211b of FIG. 2 and a controller), while the ground may be connected to one of the conductors (e.g., conductor 211d) or otherwise to ground. The ground conductive elements may be separate as shown, or the two sections may share a common ground element. Each LED set 300 may also have its own heat sink framework such as, for example, a metal clad substrate that transmits heat to the heat sink of the light fixture body. In an embodiment, the multiple LEDs or dies may have same or different light emission wavelengths. For example, the light wavelength can be selected from ultraviolet light of 200-410 nm, blue light of 410-500 nm, green light of 500-570 nm, yellow light of 570-580 nm, amber light of 580-590 nm, red light of 590-650 nm, deep red light of 650-680 nm, and infrared light of 680-960 nm.

Thus, the sections of the LED sets in each LED module can be grouped into units having common luminescent properties. Each module-level conductor drives one of the units so that all sections of all of the LED sets corresponding to that unit are driven by one of the module-level conductors.

According to an embodiment, each LED set includes two or more sections 303a and 303b, optionally separated by one or more non-conductive dividers 306 (made of silicone or any other suitable nonconductive material). In an embodiment, the non-conductive divider may prevent mixing of light from different sections. Each section has a phosphor coating covering the LEDs in the respective section. The phosphor coating layers of each section may have different emission characteristics with respect to each other, so that at least two of the sections will have different luminescent properties. The properties may be different colors (emission spectra), different color temperatures, different wavelengths, different persistences, different chromaticity, different color rendering indices (CCT), different correlated color rendering indices (CRI), different Duv values, and/or other properties. Each phosphor coating may include phosphor particles disposed in one or more active layers over the LEDs, such as over the inner surface of an optical component that covers the LEDs s and/or directly over the LEDs. In an embodiment, the phosphors are mixed in a suitable solvent medium with a binder and, optionally, a surfactant and a plasticizer. The resulting mixture is deposited by any of spraying, screen printing, blade coating, jetting, or other suitable means. In an embodiment, by varying the type and relative concentration of phosphor particles, and type and concentration of dies in each of the sections, different emission spectra from each section may be achieved.

Phosphors are luminescent materials that absorb radiation of a particular wavelength and emit radiation in another wavelength. The emitted radiation generally has a larger wavelength than that of the absorbed radiation. The excitation of the phosphor thereby occurs in the ultraviolet (UV) light range or in the visible range. Available phosphors are commonly excited in wide wavelength ranges, and these are referred to as excitation spectra. Also the emission does not occur at one wavelength but over a certain wavelength range. Through careful tuning of the phosphor composition and structure, the spectral content of the emitted light can be tailored to meet certain performance criteria.

By way of example, phosphors may be chosen from the set denoted by the following chemical formulas: $Y3Al5O12$:Ce, (also known as YAG:Ce, or simply YAG) $(Y,Gd)3Al5O12$:Ce, CaS:Eu, SrS:Eu, $SrGa2S4$:Eu, $Ca3(Sc,Mg)2Si3O12$:Ce, $Ca3Sc2Si3O12$:Ce, $Ca3Sc2O4$:Ce, $Ba3Si6O12N2$:Eu, $(Sr,Ca)AlSiN3$:Eu, $CaAlSiN3$:Eu, $CaAlSi(ON)3$:Eu, $Ba2SiO4$:Eu, $Sr2SiO4$:Eu, $Ca2SiO4$:Eu, $CaSc2O4$:Ce, $CaSi2O2N2$:Eu, $SrSi2O2N2$:Eu, $BaSi2O2N2$:Eu, $Ca5(PO4)3Cl$:Eu, $Ba5(PO4)3Cl$:Eu, $Cs2CaP2O7$, $Cs2SrP2O7$, $Lu3Al5O12$:Ce, $Ca8Mg(SiO4)4Cl2$:Eu, $Sr8Mg(SiO4)4Cl2$:Eu, $La3Si6N11$:Ce, $Y3Ga5O12$:Ce, $Gd3Ga5O12$:Ce, $Tb3Al5O12$:Ce, $Tb3Ga5O12$:Ce, and $Lu3Ga5O12$:Ce.

It will be understood to those skilled in the art that a phosphor coating is used as an example in this disclosure, and other color conversion materials such as dichroic dyes and quantum dots may also be used.

In an embodiment, each section of an LED set may be configured to emit light in a certain color temperature range using various permutations and combinations of concentration and emission spectra of the dies in each section and/or the concentration and the emission spectra of the phosphor layer in each section. The emission spectra of each section may be adjusted to emit light in the desired color temperature range. In an embodiment, the color temperature of a an LED set may be controlled by selectively controlling the drive currents delivered to each section of an LED set, while maintaining a constant overall illuminance.

For example, in the LED set of FIG. 3, section 303a (Section 1) may be coated with a phosphor having properties that are configured to emit light in a range of 3000-4000K, and section 303b (Section 2) may be coated with a phosphor having properties that are configured to emit light in a range of 6000-7000K, or vice versa. This may be done by forming a set of dies, each of which has the same or substantially similar emitting properties, which two sections in which each phosphor has a different emitting property. For example, the phosphor layer of Section 1 may be configured to emit light at approximately 3500K, while the phosphor layer of Section 2 may be configured to emit light at approximately 6500K.

Hence, by controlling the drive currents delivered to the two sections, the color temperature of the LED set may be adjusted for a range of 3000K-7000K. For example, if Section 1 requires 300 mA of current, and Section 2 requires 300 mA of current to deliver light at constant illuminances (based on power output), by varying the current from 0-300 mA in Section 1 and 0-300 mA in Section 2, any desired color temperature light, in the range 3000K-7000K, may be emitted from the COB LED. In an embodiment, if the system receives a command to emit light at a specified color temperature, it may use an algorithm, reference a lookup table, or use other suitable methods to determine what drive currents to apply to each section to achieve the desired temperature. For example, in an embodiment, the system may deliver a color temperature of approximately 4500-4600 K by delivering a drive current of approximately 155-180 mA to both Sections 1 and 2; a color temperature of approximately 5400-5600 K by delivering a drive current of approximately 250-275 mA to Section 2 and approximately 65-85 mA to Section 1; a color temperature of approximately 3800-4100 K by delivering a drive current of approximately 250-275 mA to Section 1 and approximately 65-85 mA to Section 2; and a color temperature of approximately 3500 K by delivering a drive current of approximately 300 mA to Section 1 and approximately 0 mA to Section 2, while maintaining a constant illuminance.

Figure 11:
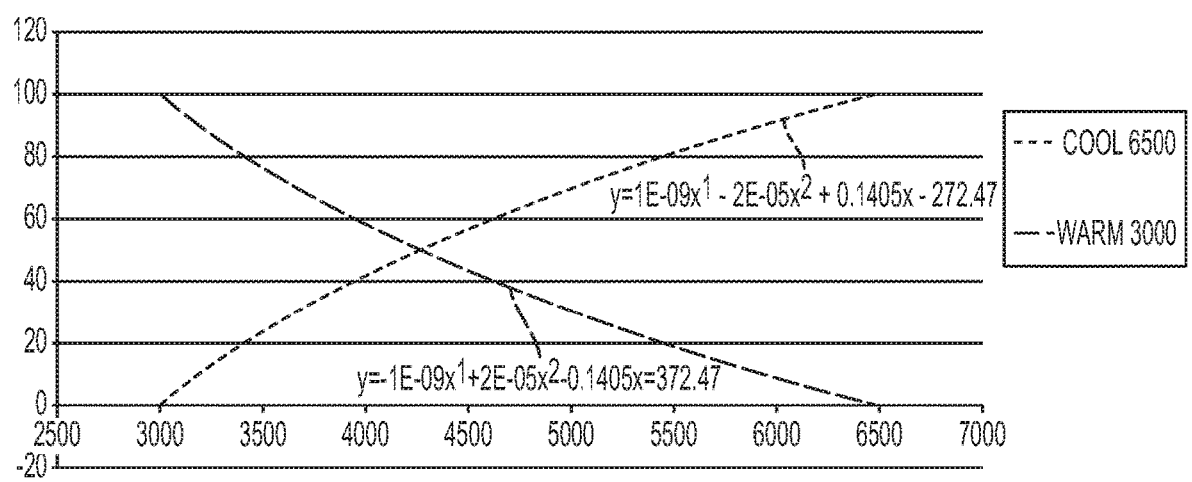
FIG. 11 illustrates an example method of adjusting color, color temperature or other output characteristics of an LED lighting device.

Other control methods are possible. For example, the system may include a user interface that with an input that enables a user to select a desired output light characteristic, either from a set of available options or any value within a range using a numeric input or adjustable tuner. FIG. 11 illustrates an example user interface in the form of a spreadsheet in which a user may select any number of settings (represented by the "DMX" column, each of which corresponds to a particular CCT value and/or percentage driven setting), and/or the CCT values themselves, each of which results from the selective activation of each section of the LED set. In the example shown, as illustrated by the graph, one section of the LED set includes a relatively cool (6500K) LED group and the other section of the LED set includes a relatively warm (3000K) LED group. The CCT value of the light output by the LED set is a function of how much of the total current is applied to each of the two sections. The function is shown in the graph, with Y-axis representing the percentage of total lumens output by each type of LED section and the X-axis representing the CCT value of the resulting output light. User selection of the 178 DMX setting (or CCT of 5440K) will cause the controller to direct 80% of the total current to the cool (6500K) LED groups in each LED set and 20% of the total current to the warm (3000K) LED groups in each LED set, yielding output light with a CCT value of 5440K. If the user selects a 91 DMX value or CCT value of 4246, the controller will apply an equal amount of current to each of the LED groups. The functions shown in FIG. 11 are by way of example for a particular LED set; other functions and graphs may apply to LEDs having different color temperature, luminance, or other characteristics.

While the example shown in FIG. 3 shows an LED set with sections that are of equal size, in other embodiments the sections may have sizes that are not all equal to each other.

The system may perform diagnostics on a chip to learn this information during an initialization process, or this information may be entered as a data file or manually and then stored in a memory of the device (or in a memory that is external to the device) for use during operation of the lighting system. It will be understood to those skilled in the art that while the two sections of the COB LED are described as having emission spectra in a color temperature range, they can also be described as emitting light of specific colors such as yellow and white light, green and red light, green and yellow light, or yellow and red light.

Figure 4A:
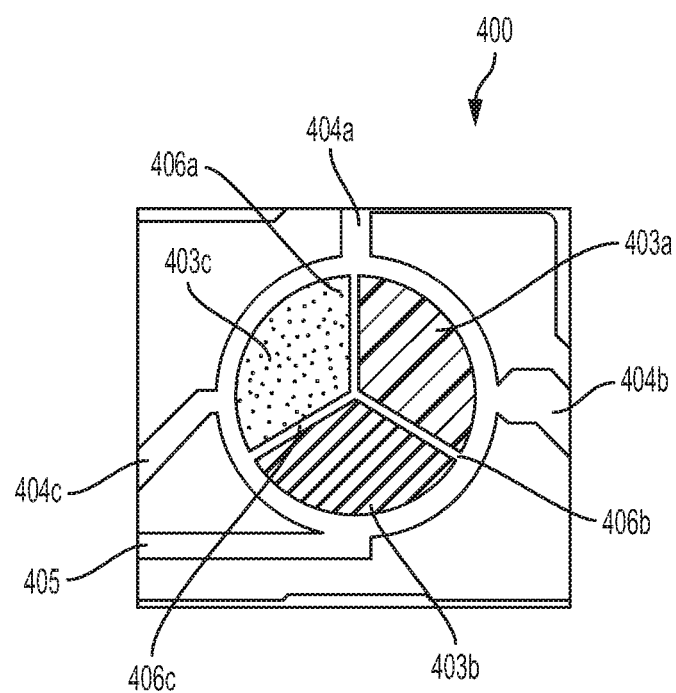
FIGS. 4A and 4B each illustrate alternate LED set configurations for providing tunable color or color temperature light, according to various embodiment.
Figure 4B:
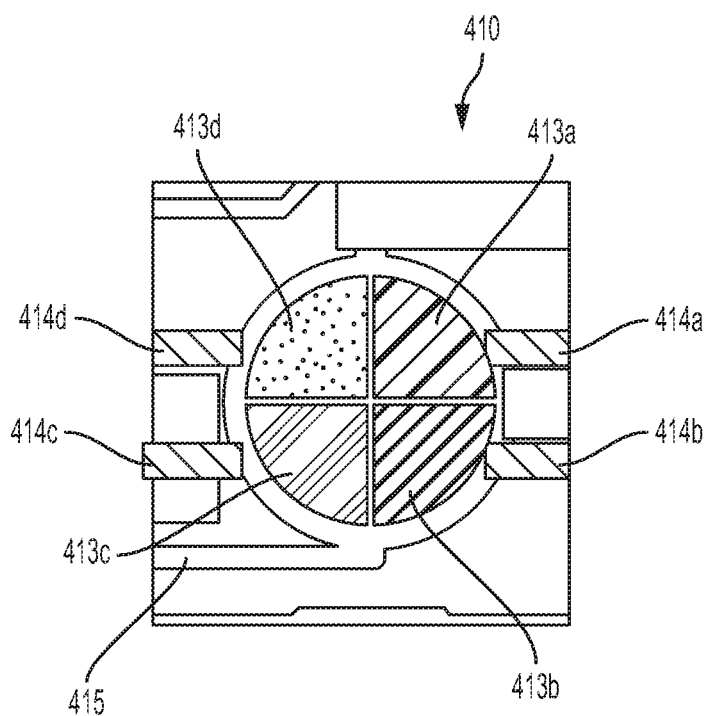

FIGS. 4A and 4B illustrate other examples of an LED set with additional numbers of sections according to embodiments in which various sections of each LED set are configured to emit light of varying colors. As shown in FIG. 4A, an LED set 400 includes a substrate 401 on which a group of LEDs are positioned under a common lens. Alternatively, each section, or various groups of LEDs within each section, may include its own associated covering lens. The LED set may be COB LEDs in which multiple dies are bonded directly to allow for optimum heat dissipation, and solderless fabrication. Alternatively, as discussed above, the LED set may be formed of CSP LEDs, or other types of LEDs. The dies or LEDs may be blue, red, yellow, or any other desired color. Further, as with the example of FIG. 3, in FIGS. 4A and 4B the LEDs (or multiple dies) are subgrouped into sections so that each subgroup is wired to operate as one electrical device with two contacts, irrespective of the number of dies or LEDs. In the LED set of FIG. 4A, each subgroup of LEDs in an LED set 400 may include three sections 403a, 403b, and 403c of LEDs, As shown in FIG. 4A, each subgroup has its own positive conductive element (404a, 404b, and 404c). The sub-groups may share a ground conductive element 405.

Each section of the LED set 400 has a phosphor coating covering the LEDs in the respective section, such that each section has a distinct emission spectrum and/or different luminescent properties. One or more of the sections may optionally be separated a silicone (or other non-conductive material) dividers 406a, 406b, and 406c. In an example embodiment, the three sections 403a, 403b, and 403c may be configured (using the methods discussed above) that one section emits blue light of 410-500 nm, a second section emits red light of 590-650 nm, and a third section emits green light of 500-570 nm. This may be done by covering the sections with phosphor layers that are made of, for example, ZnS:Ag (blue) $Y_2O_2S:Eu+Fe_2O_3$ (red), and ZnO:Zn (green). Other phosphor layer materials that will emit light in the appropriate color ranges may be used. In an embodiment, color temperature of an LED set 400 may be controlled by controlling the drive currents delivered to each section of the LED set using known methods to obtain a desired color temperature, while maintaining a constant overall illuminance.

FIG. 4B illustrates an LED set 410 that is similar to the LED set 400 of FIG. 4A but includes four sections 413a, 413b, 413c, and 413d, optionally separated by non-conductive dividers, and in which each section has a phosphor coating covering the LEDs in the respective section such that each section has a distinct emission spectrum (e.g., red, green, blue, and amber). In this situation, phosphor layers made of materials such as those described above, along with a layer made of $InBO_3:Tb+InBO_3:Eu$ (amber), may be used. Each section has its own positive conductive element (414a, 414b, 414c and 414d). The sections may share a ground conductive element 415. Other embodiments may include more or less number of sections in a COB LED such as 5, 6, 7, or the like. In addition, while the examples shown in FIGS. 4A and 4B show LED sets with sections that are of equal size, in other embodiments the sections may have sizes that are not all equal to each other.

Referring back to FIGS. 1 and 2, a lighting device 100 may include one or more LED modules 110, each of which includes several sets of LEDs 202a-202h. In an embodiment, the LED modules and their corresponding LED sets may be positioned in the housing 101 such that a uniform color temperature and/or intensity of light is emitted in all directions. For example, as shown in FIG. 2, the LED sets 202a-202h are arranged such that orientation of each LED set is reversed 180° with respect to its neighboring LED sets. Specifically, Section 1 of alternating LED sets is on the left side with Section 2 on the right side, such that Section 1 of the remaining alternate LED sets is on the right side with Section 2 on the left side. The LED sets 202a-202h of FIG. 2 may be replaced with LED sets including different numbers of sections, such as those shown in FIGS. 4A and 4B. In an embodiment, if the individual LED sets of a lighting device include three distinct sections (such as that shown in FIG. 4A), each subsequent LED sets after a first LED set exhibits a phase shift so that it is positioned such that it is rotated 120° in the clockwise or counterclockwise direction (such as the LED set shown in FIG. 4A) with respect to any adjacent LED sets on the substrate. In an embodiment, if the individual LED sets of a lighting device include four distinct sections (such as the LED set shown in FIG. 4B), each subsequent LED set after a first LED set exhibits a phase shift so that it is positioned such that it is rotated 90° in the clockwise or counter clockwise direction with respect to adjacent LED sets (as shown in FIG. 4B). Similarly, referring back to FIG. 2 and the LED set of FIG. 3, in a two-section embodiment, the LED sets may be variously positioned at alternating 180° rotations. Although FIG. 3 illustrates particular angles of rotation, any skew (i.e., rotation) with respect to adjacent LED sets is possible, and each LED set need not exhibit the same skew as compared to other LED sets in an LED module.

While the current disclosure illustrates example lighting devices having a single type of LED set, it will be understood to those skilled in the art that a lighting device may include different types of LED sets that may be individually controlled to provide light of a desired color temperature. For example, some LED sets of a lighting device, or of an LED module within a device, may include two (or a first number) of sections, while other LED sets in the device or LED module may include four (or a different number of) sections. Also, various LED sets of an LED module or lighting device may include different combinations of phosphors. In an embodiment, the different LED sets of a lighting device may be individually controlled such that they all provide light of the same desired color temperature (such that the light from the lighting device also has the overall desired color temperature). Alternatively and/or additionally, the different LED sets of a lighting device may be individually controlled such that they provide light in different color temperatures such that the combination of the different color temperatures provides light in an overall desired color temperature from the lighting device. In an embodiment, if the system receives a command to emit light at a specified color temperature, it may use an algorithm, reference a lookup table, or use other suitable methods to determine what drive currents to apply to each section of individual LED set to achieve the desired color temperature. It should be noted that a constant illuminance is maintained while performing color tuning of the lighting device to obtain the desired color temperature.

In another aspect of this disclosure, a lighting device with beam width tuning capabilities to dynamically create desired beam patterns (spreads) is disclosed.

The light distribution of a floodlight is known as the "beam spread." Beam spread types may be classified based on one or more standards, such as those established by the National Electric Manufacturer's Association (NEMA). When used with reference to beam spread, the "NEMA type" ranges from type 1 (most narrow) to type 7 (widest spread) and may be determined by two angles (horizontal and vertical), where the light intensity is 10% of the maximum beam intensity. Examples of beam spread classifications include NEMA type 1 (beam spread 10-18 degrees), NEMA type 2 (beam spread 18-29 degrees), NEMA type 3 (beam spread 29-46 degrees), NEMA type 4 (beam spread 46-70 degrees), NEMA type 5 (beam spread 70-100 degrees), NEMA type 6 (beam spread 100-130 degrees), and NEMA type 7 (beam spread 130 degrees and up). The NEMA designation determines how wide or narrow the light is projected out of a floodlight. In an example, if the horizontal beam spread of a lighting device is 100° and the vertical beam spread of the lighting device is 46°, then the NEMA type for the device is 5×3. Other parameters of the output light, such as peak candela (brightness) and candela per lumen, may be used in the control of beam spread and/or width in the embodiments below.

Figure 5:
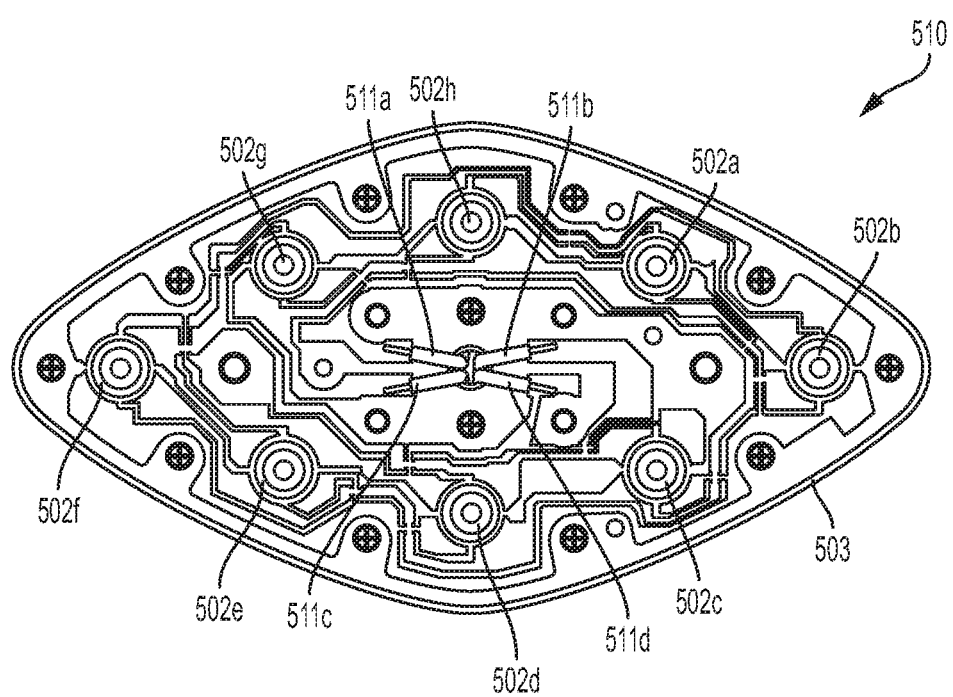
FIG. 5 illustrates an LED module with tunable beam spread characteristics, according to an embodiment.

FIG. 5 illustrates a lighting device LED module 510 that includes beam spread tuning capabilities using optical and/or electrical components. The LED module 510 of FIG. 5 is similar to the LED module 110 of FIG. 2 in that it includes various LED sets 502a-502h, attached to a substrate 503, and it is configured to fit within a housing of a lighting device such as device 100 of FIG. 1. However, the LED sets 502a-502h included in the LED module 510 of FIG. 5 provide beam spread tuning capabilities, as discussed below with respect to FIG. 6.

As with the embodiment of FIG. 2, in FIG. 5 various conductors and/or electronic devices, and lenses for the LED sets, may be mounted on the substrate. For example, a set of module-level conductors 511a-511d may be connected to the lighting device's power source (via a controller) and ground. Each module-level conductor may be connected to one of the conductive elements for each LED set (described below) to selectively deliver current to one of the LED sections in each LED set.

Also as with the embodiment of FIG. 2, in FIG. 5 one or more control circuits (such as control cards) may be positioned under, adjacent to or otherwise near the LEDs to provide power to each LED set. The LEDs to which power is supplied may be selectively controlled by control circuitry. The control circuit may include a supporting substrate made of a material such as fiberglass, and a non-transitory computable-readable memory for storing programming instructions and/or monitored data and/or operational history data, one or more processors, an FPGA, ASIC or other integrated circuit structures, and a received for receiving control signals from an external transmitter.

Figure 6:
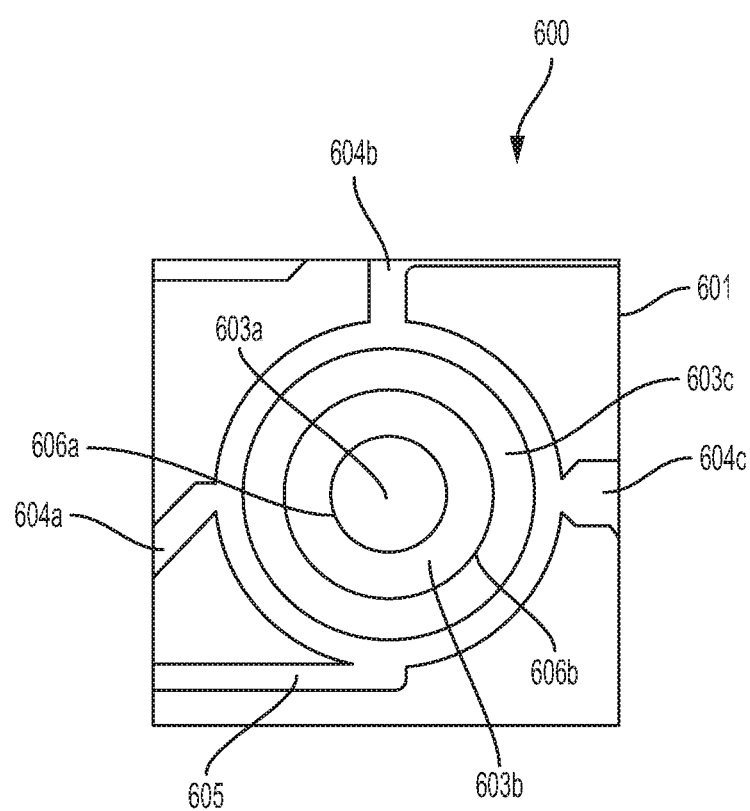
FIG. 6 illustrates an LED set that may be included in the LED module of FIG. 5 and configured for providing tunable beam spread, according to an embodiment.

As shown in FIG. 6 illustrating an expanded view of an LED set, an LED set 600 includes a substrate 601 on which a group of LEDs (not specifically shown, but contained in each section 603a-c) are positioned under a common lens. Alternatively, each section, or various groups of LEDs within each section, may include its own associated covering lens. The LED set may be COB LEDs in which multiple dies are bonded directly to allow for optimum heat dissipation, and solderless fabrication. Alternatively, the LED set may be formed of CSP LEDs, or other types of LEDs. Each LED set may also have its own heat sink framework such as, for example, a metal clad substrate that transmits heat to the heat sink of the light fixture body.

Further, as discussed above with respect to FIG. 2, the LEDs (or multiple dies) may be subgrouped so that each sub-group is wired to operate as one electrical device with two contacts, irrespective of the number of dies or LEDs. In the LED set of FIG. 6, the subgroups of LEDs in the LED set 610 may make up three sections 603a, 603b, and 603c. As shown in FIG. 6, each subgroup has its own positive conductive element (604a, 604b, and 604c). The sub-groups may share a ground conductive element 605. Although three sections (subgroups) are shown in FIG. 6, any number of sections may be provided. Each conductive element 604a, 604b, and 604c will be electrically connected to one of the module-level conductors (e.g., conductors 511a-511d of FIG. 5) to selectively receive power as controlled by a controller.

In an embodiment, sections 603a, 603b, and 603c (Section 1, Section 2, and Section 3) of the LED set may be arranged in concentric rings that are separated by dividers 606a and 606b that are formed of silicone or another non-conductive material. The shape and size of each section of the LED set will exhibit a particular beam spread of light, with the innermost section 603a having the narrowest beam spread and the outermost section 603c having the widest beam spread. The beam spread of each section may be further configured using one or more optical properties (such as focal length of a part of the lens covering a section) and/or placement of the LEDs or dies, designed to produce a particular output beam angle and thus control beam divergence) of light emitted from the LEDs or dies.

The beam spread of light emitted by the LED sets may be controlled by a controller that is controlled to vary the beam spread of light emitted by the device by selectively activating the LEDs sections of each LED sets. Selective activation may be binary (i.e., turning the LEDs in a particular section on or off), or by varying a level of current delivered to each section. In an embodiment, the sections may be arranged concentrically, but other arrangements and configurations are within the scope of this disclosure.

Furthermore, two or more output beam angles from two or more sections may be combined (additively and/or by superimposing) to provide different permutations and combinations of beam widths and beam spreads, along with varying intensities of light. In an embodiment, the beam widths for each section are different, with the beam widths increasing from smallest at central Section 1 and the widest at peripheral Section 3, but the intensities of light emitted by each section are the same so that selective activation of each section will vary the beam spread of light emitted by the LED module without varying the intensity of light emitted as the beam spread changes. Alternatively, the intensity of light emitted may be increased as the beam spread increases by activating two or more of the sections of each LED set at the same time.

For example, in the LED set of FIG. 6, section 603a (Section 1) may be configured to emit a NEMA 1 beam spread (i.e., 10° to 18°), and section 603b (Section 2) may be configured to output a NEMA 2 beam spread (i.e., 18° to 29°), and section 603c (Section 3) may be configured to output a NEMA 3 beam spread (i.e., 29° to 46°). Hence, by selectively controlling the drive currents delivered to the three sections, the overall beam spread of the LED set may be dynamically adjusted to deliver light in beam widths corresponding to NEAM 1, NEMA 2, NEMA 3, or a combination thereof. For example, if Section 1 requires X mA of current, Section 2 requires Y mA of current, and Section 3 requires Z mA of current, by varying the current from 0-X mA in Section 1, 0-Y mA in Section 2, and 0-Z mA in Section 3, the beam pattern of light emitted from the LED set may be controlled. For example, if 0 mA current is delivered to Section 2 and Section 3, a NEMA 1 beam pattern of light will be achieved. In another example, some non-zero drive current in the above ranges may be delivered to all three sections to achieve a desired beam pattern. In an embodiment, if the system receives a command to output light in a specific beam pattern, it may use an algorithm, reference a lookup table that is stored in a memory, or use other suitable methods to determine what drive currents to apply to each section to achieve the desired beam pattern. The system may be programmed to learn this information during an initialization process, or this information may be entered as a data file or manually and then stored for use during operation of the lighting system.

While FIGS. 5 and 6 illustrate LED sets with three sections, different numbers of sections, each having a specific output beam pattern, are within the scope of this disclosure. In addition, while current disclosure illustrates example lighting devices having the same type of LED sets, it will be understood to those skilled in the art that a lighting device may include different types of LED sets that may be individually controlled to provide light of a beam pattern. In an embodiment, the different LED sets of an LED module or a lighting device may be individually controlled such that they all provide light of the same desired beam pattern (such that the light from the LED module and/or lighting device also has the overall desired beam pattern). Alternatively and/or additionally, the different LED modules of a lighting device may be individually controlled such that they provide light in different beam patterns such that the combination of the different beam patterns provides light in an overall desired beam pattern from the lighting device. In an embodiment, if the system receives a command to emit light at a specified beam pattern, it may use an algorithm, reference a lookup table, or use other suitable methods to determine what drive currents to apply to each section of individual LED set to achieve the desired beam pattern. In addition, any LED module may include any combination of LED set types disclosed in this document, such as some that permit control of output color and/or color temperature, some that permit control of the beam spread, and some that permit control of the beam shape. In some embodiments, a constant illuminance and/or color temperature may be maintained while performing beam pattern tuning of the lighting device to obtain the desired beam pattern.

In some embodiments, the various sections of an LED set such as that shown in FIG. 6 may have a specific beam spread as well as a specific color temperature output (or color emission range) such that both the beam spread and the color or color temperature of the LED set are tunable. In such embodiments, the multiple LEDs or dies may be configured to exhibit light of the same wavelength, or of or different light wavelengths. For example, the light wavelength of any section can be selected from ultraviolet light of 200-410 nm, blue light of 410-500 nm, green light of 500-570 nm, yellow light of 570-580 nm, amber light of 580-590 nm, red light of 590-650 nm, deep red light of 650-680 nm, and infrared light of 680-960 nm. Each LED set may be configured to emit light at a specific color temperature, for example from 2000K to 7000K. The configuration of each section to emit light at different colors and/or color temperatures may be done with phosphor coatings and/or other designs as discussed above in the context of FIG. 3. As discussed above, the color temperature output may be controlled by using various permutations and combinations of concentration and emission spectra of the LEDs in each section and/or the properties (such as concentration and the emission spectra) of the phosphor layer in each section.

For example, referring to FIG. 6, Section 1 603a may be configured to emit light in a range of 3000-4000K, Section 2 603b may be configured to emit light in a range of 6000-7000K, and Section 3 603c may be configured to emit light in the 3000-4000K range. Alternatively, Section 1 603a may be configured to emit light in a range of 6000-7000K, Section 2 603b may be configured to emit light in a range of 3000-4000K, and Section 3 603b may be configured to emit light in the 6000-7000K range. Other color temperature ranges and combinations are possible. Hence, in an embodiment, the drive currents delivered to the various sections may be dynamically manipulated to provide an adjustable overall the color temperature in the range of 3000K-7000K, as well as to control the beam pattern of the light delivered from the LED set using the principles discussed above. Sections 1-3 may be configured to emit light of different colors (e.g., red-green-blue).

Figure 12B:
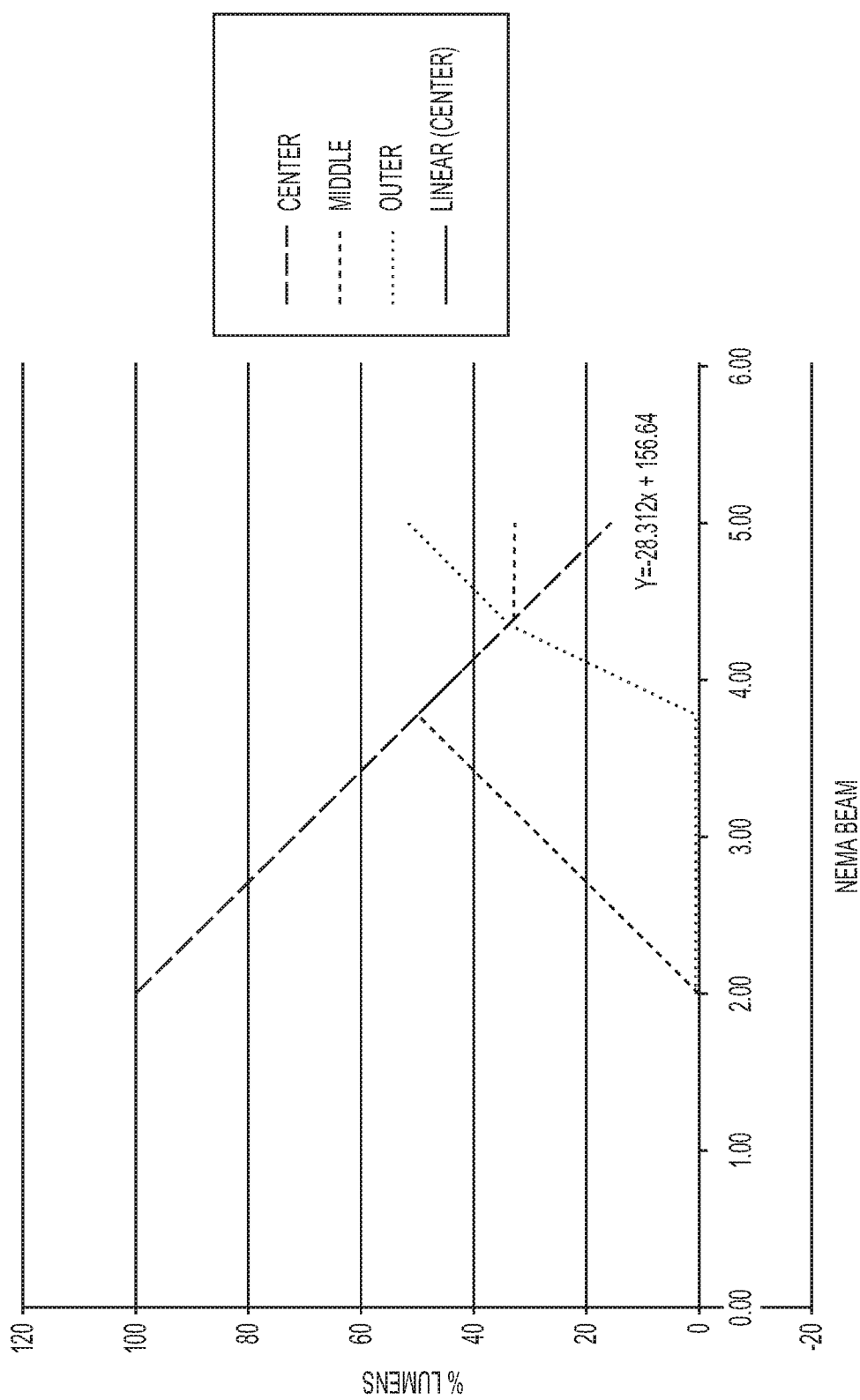

Other control methods are possible. For example, the system may include a user interface that with an input that enables a user to select a desired output light characteristic, either from a set of available options or any value within a range using a numeric input or adjustable tuner. FIG. 12A illustrates an example user interface in the form of a spreadsheet in which a user may select any number of settings (such as a candela output level, a beam width, and/or a DMX setting corresponding to a particular scene), each of which corresponds to the relative application of a percentage of the total drive current to and/or total lumens output by each section of the LED set. FIG. 12B illustrates the functions of FIG. 12A in graphic format. In the example shown, each LED set includes three sections, each of which is relatively cooler or warmer (in color temperature values and/or lumens output per drive current amount) with respect to each of its adjacent sections. Selection of various settings will result in application of various portions of the total current to each section of each LED set. The function is shown in the graph, with Y-axis representing the percentage that each LED section contributes to the total lumens output by the LED set, and the X-axis representing the NEMA beam spread value of the resulting output light. The controller may adjust each LED section's percentage contribution to the total lumens output by varying the percentage of total drive current delivered to each LED section.

As discussed above, different numbers of sections, each having a specific output beam pattern and color temperature (or color range such as RGBA), are within the scope of this disclosure. Furthermore, a lighting device and/or LED module may include LED sets of a single type, or different individually controlled LED sets.

In another aspect of this disclosure, a lighting device with beam shaping capabilities to dynamically create desired beam shapes is disclosed.

Figure 7:
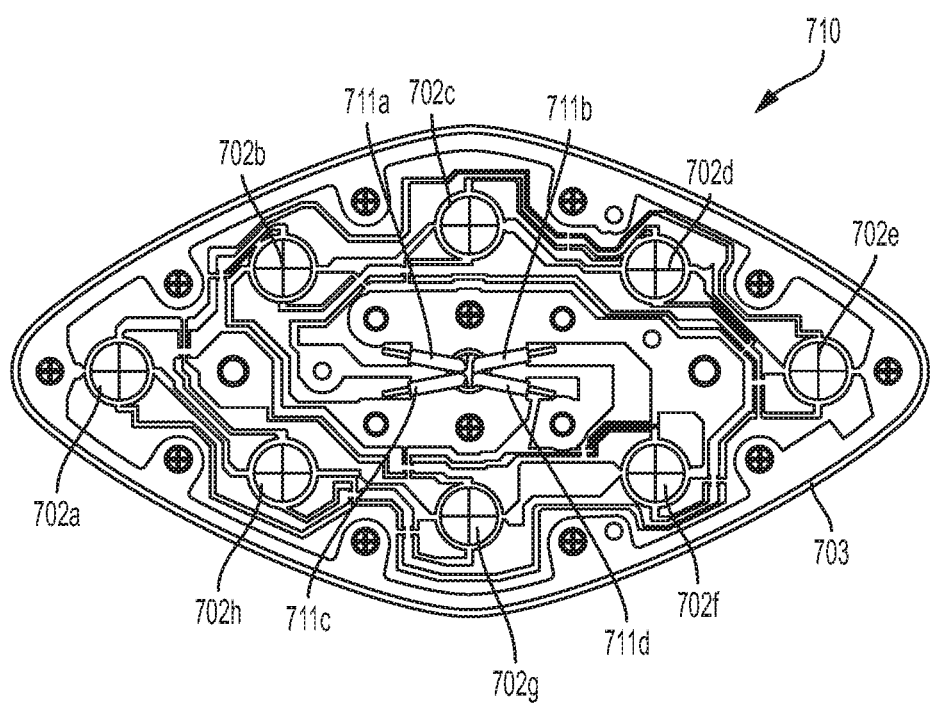
FIG. 7 illustrates an LED module with tunable beam shaping and directional characteristics, according to an embodiment.

FIG. 7 illustrates an LED module 703 which includes beam shaping capabilities (which are not fixed at the time of manufacture) using optical and/or electrical components.

The LED module 710 of FIG. 7 is similar to the LED module 110 of FIG. 2 in that it includes one or more LED sets 702a-702h, attached to a substrate 703, and is configured to fit within a housing of a lighting device. However, in this embodiment the LED sets included in the LED module 700 provide beam shaping capabilities, as discussed below with respect to FIG. 8.

As with the embodiment of FIG. 2, in FIG. 7 various conductors and/or electronic devices, and lenses for the LED sets, may be mounted on the substrate. For example, a set of module-level conductors 711a-711d may be connected to the lighting device's power source (via a controller) and ground. Each module-level conductor may be connected to one of the conductive elements for each LED set (described below) to selectively deliver current to one of the LED sections in each LED set.

Also as with the embodiment of FIG. 2, in FIG. 7 one or more control circuits (such as control cards) may be positioned under, adjacent to or otherwise near the LEDs to provide power to each LED set. The LEDs to which power is supplied may be selectively controlled by control circuitry. The control circuit may include a supporting substrate made of a material such as fiberglass, and a non-transitory computable-readable memory for storing programming instructions and/or monitored data and/or operational history data, one or more processors, an FPGA, ASIC or other integrated circuit structures, and a received for receiving control signals from an external transmitter.

Figure 8:
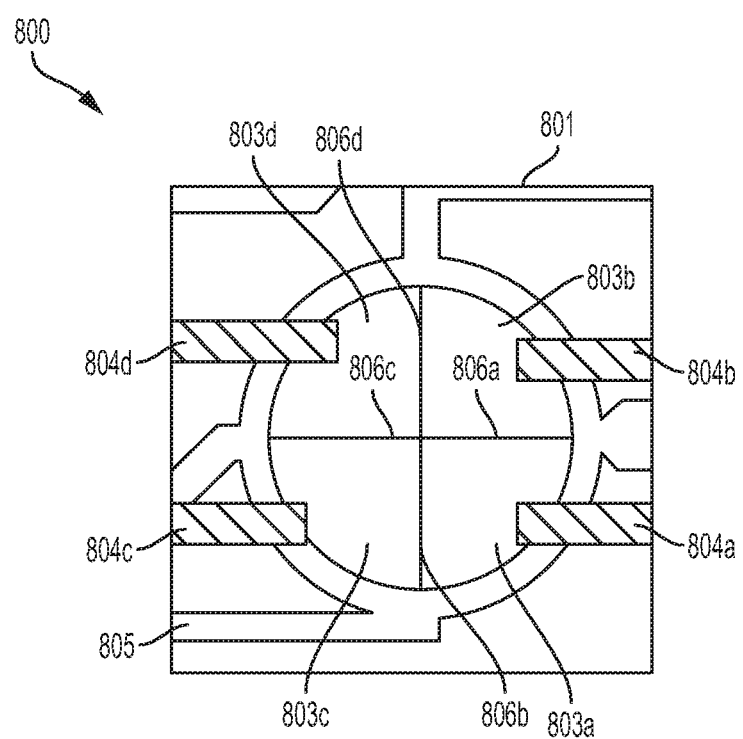
FIG. 8 illustrates an LED set that may be included in the LED module of FIG. 7 and configured for providing tunable beam shapes/directions, according to various embodiments.

As shown in FIG. 8 illustrating an expanded view of an LED set of the type shown in FIG. 7, an LED set 800 includes a substrate 801 on which a group of LEDs (not specifically shown, but contained in each section 803a-803d) are positioned under a common lens. The LED set may be COB LEDs in which multiple dies are bonded directly to allow for optimum heat dissipation, and solderless fabrication. Alternatively, the LED set may be formed of CSD LEDs, or other types of LEDs. Each LED set may also have its own heat sink framework such as, for example, a metal clad substrate that transmits heat to the heat sink of the light fixture body. In an embodiment, the multiple LED dies may have same or different light wavelengths. For example, the light wavelength can be selected from ultraviolet light of 200-410 nm, blue light of 410-500 nm, green light of 500-570 nm, yellow light of 570-580 nm, amber light of 580-590 nm, red light of 590-650 nm, deep red light of 650-680 nm, and infrared light of 680-960 nm. The LED set is configured to emit light at one or more specific color temperatures, for example from 2000K to 7000K.

Further, as with other embodiments discussed above, in this LED set the LEDs (or multiple dies) are subgrouped into sections so that each sections is wired to operate as one electrical device with two contacts, irrespective of the number of dies or LEDs within the section. In the LED set of FIG. 8, subgroups of LEDs in the LED set 800 make up four sections 803a-803d. The sections may optionally be separated non-conductive dividers 806a-806d made of silicone or any other suitable non-conductive material. Each section has its own positive conductive element (804a-804d) that is connected to one of the module-level conductors (e.g., conductors 711a-711d of FIG. 7). The sub-groups may share a ground conductive element 805. Additional numbers and configurations of sections are possible.

In an embodiment, sections 803a-803d (Section 1, Section 2, Section 3, and Section 4) of the LED set are positioned to form quadrants and are thus may be configured such that the LEDs of each section provide light in a desired direction. The direction of light provided by each section may be configured using one or more optical properties (such as focal length a part of lens covering a section), configuration of LEDs and/or phosphors in each section, or the like, designed to produce a desired output light emission angle. In the embodiment shown in FIG. 8, the sections are arranged as four uniform quadrants of a round LED set. It will be understood to those skilled in the art that other uniform or non-uniform shapes of the sections and/or the LED set are within the scope of disclosure and may be designed to output light in a pre-defined direction.

In an embodiment, the directions of light provided by two or more sections of an LED set may be combined in different permutations or combinations to configure the overall shape of a beam of light provided by the LED set. In an embodiment, the beam shape of light provided from an LED set may be controlled by controlling the drive currents delivered to the dies in each section of the LED set, while maintaining a constant overall illuminance and color temperature.

For example, in the LED set of FIG. 8, each section, i.e., section 803a (Section 1), section 803b (Section 2), section 803c (Section 3), and section 803d (Section 4) may be configured to output light in a radially outwards direction. Hence, by controlling the drive currents delivered to the four sections, the overall beam shape of the light output from the LED set may be dynamically adjusted. For example, if Section 1 requires W mA of current, Section 2 requires X mA of current, Section 3 requires Y mA of current, and Section 4 requires Z mA of current by varying the current from 0-W mA in Section 1, 0-X mA in Section 2, 0-Y mA in Section 3, and 0-Z mA in Section 4 the beam shape of light output from the LED set may be controlled, while maintaining a constant illuminance level. Each of the sections of an LED set may provide equal light intensity at their respective maximum drive currents.

Figure 9:
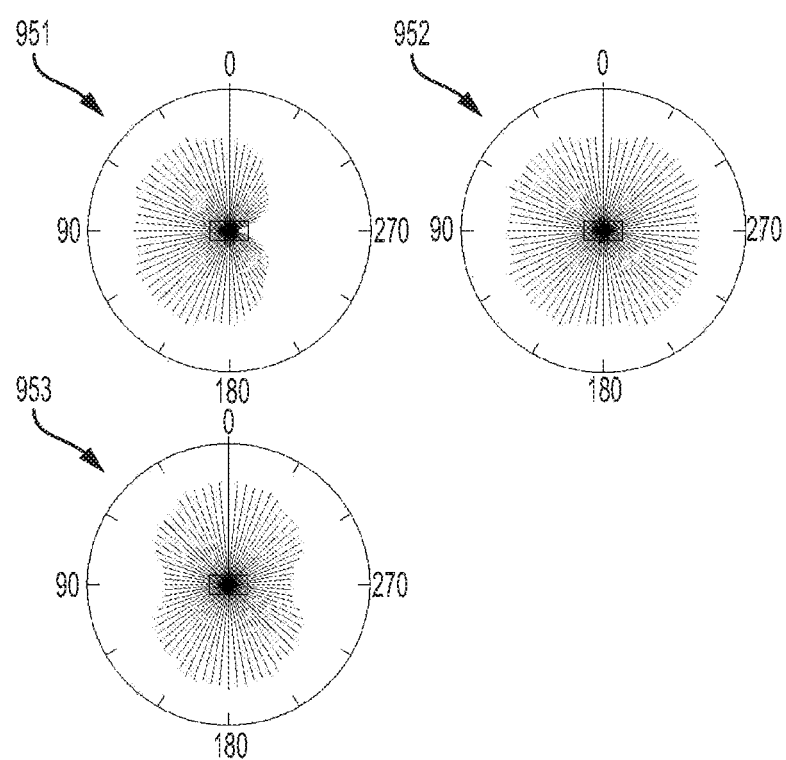
FIG. 9 illustrates different intensity distribution diagrams of patterns of light formed using beam shaping of a lighting device, according to various embodiments.

Example illumination distributions of different beam shapes obtained by controlling drive currents to various sections of the LED set of FIG. 8 are illustrated in FIG. 9. In FIG. 9, image 951 illustrates the illumination distribution of a beam shape obtained by providing maximum current (or drive currents that provide equal intensity) to Sections 1 and 3 (i.e., W mA to Section 1 and Y mA to Section 3), and providing less than maximum drive currents to Section 2 (<X mA) and Section 4 (<Z mA). Image 952 illustrates the illumination distribution of a beam shape obtained by providing drive currents to each section such that they output equal intensities of light, to provide a uniform illumination distribution. Image 953 illustrates a beam shape in which upper and lower sectors are driven at a 0.75× intensity while right and left sectors are driven at a 0.25× intensity.

In an embodiment, if the system receives a command to emit light in a specific beam shape, it may use an algorithm, reference a lookup table, or use other suitable methods to determine what drive currents to apply to each section to achieve the desired beam shape. The system may perform diagnostics on a chip to learn this information during an initialization process, or this information may be entered as a data file or manually and then stored for use during operation of the lighting system.

While FIGS. 7 and 8 illustrate LED sets with four sections, LED sets with different numbers of sections, such as 2, 3, 5 or 6 sections, are within the scope of this disclosure. While the current disclosure illustrates example LED modules 810 having a single type of LED set, it will be understood to those skilled in the art that a lighting device or LED module within the device may include different types of LED sets that may be individually controlled to provide light of a desire beam shape. In an embodiment, the different LED sets of a lighting device may be individually controlled such that they all provide light in a single direction (such as radially outwards). Alternatively and/or additionally, the different LED sets of a lighting device may be individually controlled such that they provide light in different directions such that the combination of the different directions provides light in an overall desired beam shapes from the lighting device. The beam shape by be controlled by a controller that is controlled to vary the beam spread of light emitted by the device by selectively activating the LEDs that are positioned under each of the sections. Selective activation may be binary (i.e., turning the LEDs in a particular section on or off), or by varying a level of current delivered to each section. In an embodiment, if the system receives a command to emit light at a specified beam shape, it may use an algorithm, reference a lookup table, or use other suitable methods to determine what drive currents to apply to each section of individual LED set to achieve the desired beam shape. It should be noted that a constant illuminance and/or color temperature is maintained while performing beam shaping of the lighting device to obtain the desired beam pattern.

As with other embodiments, each section 803*a*-803*d* may be configured to output the same color and color temperature of light, or different sections may use phosphor coatings or other structures to output light having various different colors, color temperatures or other characteristics.

As discussed above, the color temperature output may be controlled by using various permutations and combinations of concentration and emission spectra of the dies in each section and/or the properties (such as concentration and the emission spectra) of the phosphor layer in each section. For example, Section 1 803*a* and Section 2 803*b* may be configured to emit light in a range of 6000-7000K, and Section 3 803*c* and Section 4 803*d* may be configured to emit light in a range of 3000-4000K. Alternatively, Section 1 803*a* and Section 2 803*b* may be configured to emit light in a range of 3000-4000K, and Section 3 803*c* and Section 4 803*d* may be configured to emit light in a range of 6000-7000K. Hence, in an embodiment, the drive currents delivered to the three sections may be dynamically manipulated to adjust the color temperature in the range of 3000K-7000K, as well as control the beam shape of the light delivered from the LED set (using the principles discussed above).

As discussed above, different number of sections, each having a specific output beam shape and color temperature (or color range such as RGBA), such as 2, 3, 4, 5, or 6 sections are within the scope of this disclosure. Furthermore, a lighting device may include a single type of LED set or different types of individually controlled LED sets.

Thus, LED modules having LED sets as shown in FIGS. 5-8 may be configured to provide capabilities for color temperature tuning, beam pattern tuning, beam shaping, or a combination thereof, using the principles discussed above.

In an embodiment, one or more of the lighting devices discussed above may include one or more internal sensors and/or may be in communication with one or more external sensors. Examples of sensors may include, without limitation, light intensity sensors, color rendering index (CRI) sensors, $D_{uv}$ sensors, color temperature sensors, temperature sensor, or the like. In an embodiment, the control circuitry of the lighting device may operate to provide the appropriate drive currents for each section of the LED sets producing light in the desired color temperature, beam pattern and/or beam shape, in response to feedback collected by the sensors.

In an embodiment, an orientation sensor (such as an accelerometer and/or a gyroscope) may be included in and/or may be in communication with a lighting device discussed above. The lighting device may operate to provide the appropriate drive currents for each section of the LED sets producing light in the desired color temperature, beam pattern and/or beam shape, in response to feedback collected by the orientation sensor. For example, a lighting device may provide appropriate drive currents for each section of the LED sets to maintain a desired beam shape, beam width, and/or color temperature at a point in the environment by compensating for change in beam shape, beam width, and/or color temperature due to a change in orientation of the lighting device using the principles discussed above.

In an embodiment, the control circuitry may control the LED sets by pulse width modulation (PWM), where an oscillating output from the processor repeatedly turns the dies on an LED set on and off by applying a pulsed voltage. Each pulse is of a constant voltage level, and the control circuitry varies the width of each pulse and/or the space between each pulse. When a pulse is active, the dies may be turned on, and when the pulses are inactive, the dies may be turned off. If the duty cycle of the "on" state is 50%, then the dies may be on during 50% of the overall cycle of the control pulses. The pulses are delivered rapidly so that the human eye does not detect a strobing effect—at least 24 pulses per second. The control card may dim the lights by reducing the duty cycle—and effectively extending the time period between each "on" pulse-so that the dies are off more than they are on. Alternatively, the control card may increase the brightness of the dies by increasing the duty cycle.

In another embodiment, the LED sets discussed above maybe include an optical component for providing a total internal reflection (TIR) optic for reflecting, collimating and further mixing the LED light.

Figure 10:
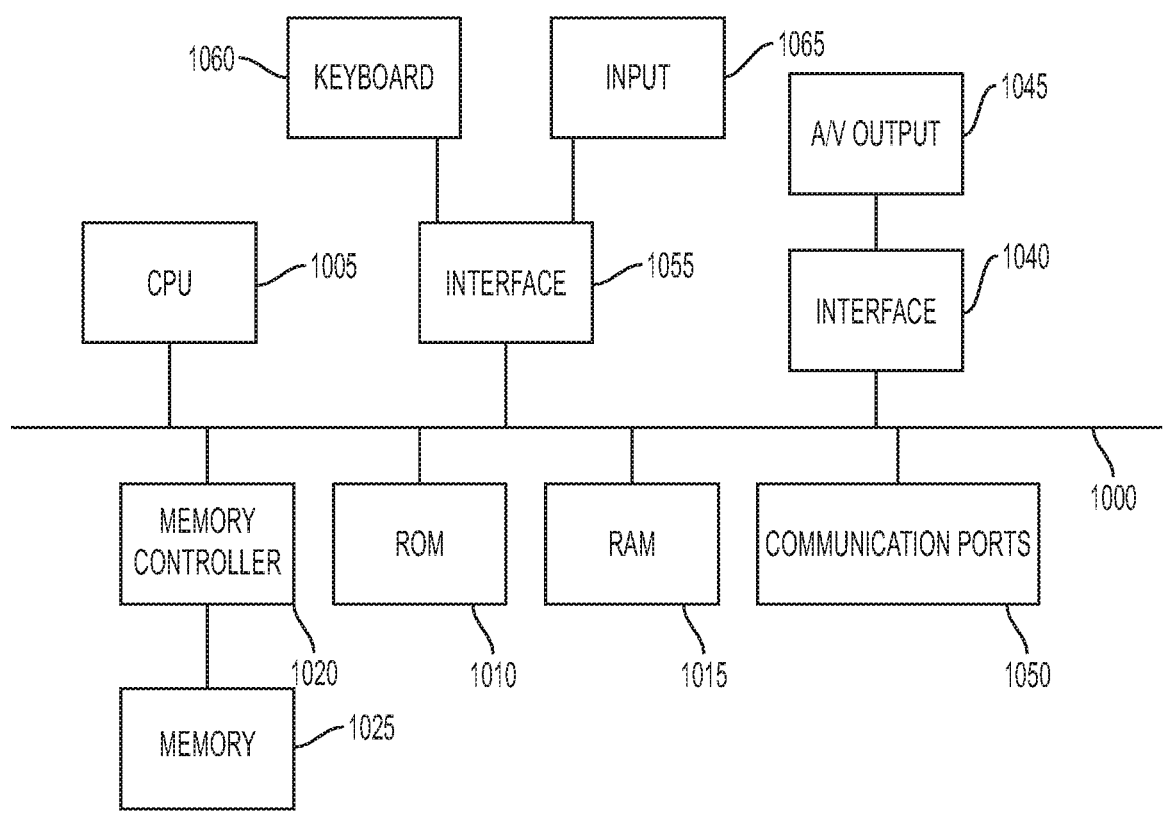
FIG. 10 illustrates example components of an electronic device for controlling a lighting device, according to an embodiment.

FIG. 10 depicts an example of internal hardware that may be used to contain or implement the various processes and systems as discussed above, and that may serve an internal or external controller for a lighting device. An electrical bus 1000 serves as an information highway interconnecting the other illustrated components of the hardware. A computing device will include one or more processors. CPU 1005 is a central processing unit of the system, performing calculations and logic operations required to execute a program. CPU 1005, alone or in conjunction with one or more of the other elements disclosed in FIG. 10, is a processing device, computing device or processor as such terms are used within this disclosure. As used in this document, the terms "processor" and "processing device" may include a single processor or a group of processors that collectively perform various steps of a process. Read only memory (ROM) 1010 and random access memory (RAM) 1015 constitute examples of memory devices. As used in this document, the terms "computer-readable medium," "memory" or "memory device" are used interchangeably and may include a single memory device, a group of memory devices, or a sector or other subdivision of such a device.

A memory controller 1020 interfaces with one or more optional memory devices 1025 that service as data storage facilities to the system bus 1000. These memory devices 1025 may include, for example, an external DVD drive or CD ROM drive, a hard drive, flash memory, a USB drive, a distributed storage medium such as a cloud-based architecture, or another type of device that serves as a data storage facility. As indicated previously, these various drives and controllers are optional devices. Additionally, the memory devices 1025 may be configured to include individual files for storing any software modules or instructions, auxiliary data, incident data, common files for storing groups of contingency tables and/or regression models, or one or more databases for storing the information as discussed above.

Programming instructions, software or interactive modules for performing any of the functional steps associated with the processes as described above may be stored in the ROM 1010 and/or the RAM 1015. Optionally, the programming instructions may be stored on a tangible computer readable medium such as a compact disk, a digital disk, flash memory, a memory card, a USB drive, an optical disc storage medium, an ASIC or FPGA, a distributed storage medium such as a cloud-based architecture, and/or other recording medium. The lighting device may be part of a system in which the memory storing programming instructions is integral with the lighting device, or the memory storing programming instructions may be external to the device (such as in a remote server), and the lighting device may access the instructions via a wired or wireless communication network.

If the system includes an audiovisual output 1045 such as a display or a speaker, an A/V interface 1040 may permit information to be displayed on the display or output via the speaker in audio, visual, graphic or alphanumeric format. Communication with external devices may occur using various communication ports 1050. A communication port 1050 may be include a receptacle for receiving a cable (such as an Ethernet cable) and/or a wireless transmitter/receiver, and it may be communicatively attached to a communications network such as the Internet, a local area network or a cellular telephone data network.

The hardware may also include an interface 1045 that allows for receipt of data from input devices such as a keyboard 1060 or other input device 1065 such as a remote control, a pointing device, touch screen display, a video input device and/or an audio input device. The interface may be, for example, a screen with an input device by which a user may select from various scenes or light characteristic settings, or specifically select particular characteristics of output light, such as the interfaces shown in FIGS. 11 and 12A.

The features and functions described above, as well as alternatives, may be combined into many other systems or applications. Various presently unforeseen or unanticipated alternatives, modifications, variations or improvements may be made by those skilled in the art, each of which is also intended to be encompassed by the disclosed embodiments.

The invention claimed is:

1. A lighting system, comprising:
   a lighting device that comprises:
     a housing, and
     one or more light emitting diode (LED) modules positioned in an opening of the housing and configured to emit light away from the housing, each LED module comprising:
       a substrate,
       a plurality of module-level conductors, and
       a plurality of LED sets, each of which comprises:
         a first section including a first group of LEDs,
         one or more additional sections, each including an additional group of LEDs,
         a first conductive element that electrically connects the first section to a first one of the module-level conductors, and
         one or more additional conductive elements, each of which electrically connects an additional section of one or more of the LED sets section to an additional one of the module-level conductors;
   a sensor that is configured to collect data corresponding to light emitted by the lighting device;
   control circuitry that is configured to:
     receive and analyze data collected by the sensor;
     based on the data collected by the sensor, generate commands to control drive currents delivered to the first group of LEDs in each LED set and each additional group of LEDs in each LED set.

2. The lighting system of claim 1, wherein the lighting device further comprises:
   a power supply; and
   a controller configured to selectively direct current from the power supply to the module-level conductors to selectively drive each of the sections of each LED set.

3. The lighting system of claim 1, wherein the lighting device further comprises one or more non-conductive dividers configured to separate each of the sections of each LED set.

4. The lighting system of claim 1, wherein the control circuitry is configured to generate commands to control drive currents delivered to the first group of LEDs in each LED set and each additional group of LEDs in each LED set such that the lighting device generates light having at least one of the following:
- a specified beam shape;
- a specified beam pattern;
- a specified color temperature; or
- a specified intensity.

5. The lighting system of claim 4, wherein the first section and at least one of the one or more additional sections are configured to emit light of different luminescent properties comprising one or more of the following:
- different colors;
- different color rendering indices;
- different Duv values; or
- different color temperatures.

6. The lighting system of claim 5, wherein the different luminescent properties comprise different color temperatures and each group of LEDs exhibits a color temperature that is a function of one or more of the following:
- a number of LEDs in the group of LEDs;
- one or more characteristics of LEDs in the group of LEDs;
- a concentration of phosphor particles in a phosphor coating on the group of LEDs; or
- one or more light emitting characteristics of a phosphor coating on the LED set.

7. The lighting system of claim 5, wherein the first section of each LED set is coated with a first phosphor coating and each additional section of each LED set is coated with one or more different phosphor coatings to provide the sections of each LED set with the different luminescent properties.

8. The lighting system of claim 4, wherein:
- the first group of LEDs in each LED set exhibits a first color;
- each additional group of LEDs in each LED set exhibits a different color; and
- the control circuitry is configured to generate commands to control drive currents delivered to each of the groups of LEDs in each LED set so that the lighting device emits light of the specified color.

9. The lighting system of claim 4, wherein:
- the first section of each LED set is shaped to emit light having a beam spread that is narrower than a beam spread of light emitted by at least one of the one or more additional sections of each LED set; and
- the control circuitry is configured to generate commands to control drive currents delivered to each of the groups of LEDs in each LED set so that the lighting device emits light of the specified beam spread.

10. The lighting system of claim 4, wherein:
- the first section of each LED set is configured to emit light having a first beam shape;
- at least one of the one or more additional sections of each LED set is configured to emit light having a second beam shape;
- the first section of each LED set and the at least one of the one or more additional sections of each LED set are, when energized together, configured to emit light having a third beam shape; and
- the control circuitry is configured to generate commands to control drive currents delivered to each of the groups of LEDs in each LED set so that the lighting device emits light of the specified beam shape.

11. The lighting device of claim 10, wherein the control circuitry is further configured to select a shape of light emitted by the lighting device by selecting a value of the drive current supplied to the first conductive element and the least one of the one or more additional sections of each LED set.

12. The lighting system of claim 1, wherein each of the LED modules of the lighting device further comprises an optical lens that covers each section of the module.

13. The lighting system of claim 1, wherein the sensor is included in the lighting device.

14. The lighting system of claim 1, wherein the sensor is external to the lighting device.

15. The lighting system of claim 1, wherein the sensor comprises at least one of the following: an intensity sensor, a color rendering index (CRI) sensors, a Duv sensors, a color temperature sensor, a temperature sensor, or an orientation sensor.

16. A light emitting diode (LED) module for a lighting device comprising:
- a substrate;
- a plurality of module-level conductors;
- a plurality of LED sets, each of which comprises:
  - a first section including a first group of LEDs,
  - one or more additional sections, each including an additional group of LEDs,
  - a first conductive element that electrically connects the first section to a first one of the module-level conductors, and
  - one or more additional conductive elements, each of which electrically connects an additional section of one or more of the LED sets section to an additional one of the module-level conductors; and
- a controller configured to generate commands to control drive currents delivered to the first group of LEDs in each LED set and each additional group of LEDs in each LED set based on data received from a sensor and relating to light generated by the LED module.

17. The lighting module of claim 16, wherein the controller is configured to generate commands to control drive currents delivered to the first group of LEDs in each LED set and each additional group of LEDs in each LED set such that the lighting module generates light having at least one of the following:
- a specified beam shape;
- a specified beam pattern;
- a specified color temperature; or
- a specified intensity.

18. The lighting module of claim 17, wherein the first section and at least one of the one or more additional sections are configured to emit light of different luminescent properties comprising one or more of the following:
- different colors;
- different color rendering indices;
- different Duv values; or
- different color temperatures.

19. The lighting module of claim 18, wherein the different luminescent properties comprise different color temperatures and each group of LEDs exhibits a color temperature that is a function of one or more of the following:
- a number of LEDs in the group of LEDs;
- one or more characteristics of LEDs in the group of LEDs;
- a concentration of phosphor particles in a phosphor coating on the group of LEDs; or
- one or more light emitting characteristics of a phosphor coating on the LED set.

20. The lighting module of claim 18, wherein the first section of each LED set is coated with a first phosphor coating and each additional section of each LED set is coated with one or more different phosphor coatings to provide the sections of each LED set with the different luminescent properties.

21. The lighting module of claim 17, wherein:
the first group of LEDs in each LED set exhibits a first color;
each additional group of LEDs in each LED set exhibits a different color; and
the control circuitry is configured to generate commands to control drive currents delivered to each of the groups of LEDs in each LED set so that the lighting module emits light of the specified color.

22. The lighting module of claim 17, wherein:
the first section of each LED set is shaped to emit light having a beam spread that is narrower than a beam spread of light emitted by at least one of the one or more additional sections of each LED set; and
the control circuitry is configured to generate commands to control drive currents delivered to each of the groups of LEDs in each LED set so that the lighting module emits light of the specified beam spread.

23. The lighting module of claim 17, wherein:
the first section of each LED set is configured to emit light having a first beam shape;
at least one of the one or more additional sections of each LED set is configured to emit light having a second beam shape;
the first section of each LED set and the at least one of the one or more additional sections of each LED set are, when energized together, configured to emit light having a third beam shape; and
the control circuitry is configured to generate commands to control drive currents delivered to each of the groups of LEDs in each LED set so that the lighting module emits light of the specified beam shape.

24. The lighting module of claim 16, wherein the sensor comprises at least one of the following: an intensity sensor, a color rendering index (CRI) sensors, a Duv sensors, a color temperature sensor, a temperature sensor, or an orientation sensor.

* * * * *